US009607990B2

(12) United States Patent
Cheng et al.

(10) Patent No.: US 9,607,990 B2
(45) Date of Patent: Mar. 28, 2017

(54) METHOD TO FORM STRAINED NFET AND STRAINED PFET NANOWIRES ON A SAME SUBSTRATE

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/839,286

(22) Filed: Aug. 28, 2015

(65) Prior Publication Data
US 2017/0062428 A1     Mar. 2, 2017

(51) Int. Cl.
| | | |
|---|---|---|
| *H01L 29/423* | (2006.01) | |
| *H01L 29/06* | (2006.01) | |
| *H01L 29/10* | (2006.01) | |
| *H01L 27/092* | (2006.01) | |
| *H01L 21/8238* | (2006.01) | |

(52) U.S. Cl.
CPC .. *H01L 27/0924* (2013.01); *H01L 21/823807* (2013.01); *H01L 21/823821* (2013.01); *H01L 29/42392* (2013.01)

(58) Field of Classification Search
CPC ............ H01L 21/823842; H01L 21/84; H01L 27/1203; H01L 27/1104; H01L 27/0924; H01L 29/42392; H01L 21/823821
See application file for complete search history.

(56) References Cited

U.S. PATENT DOCUMENTS

| | | | |
|---|---|---|---|
| 6,525,338 B2 | 2/2003 | Mizushima et al. | |
| 7,223,994 B2 | 5/2007 | Chidambarrao et al. | |
| 7,384,830 B2 * | 6/2008 | Cohen | H01L 21/82341 |
| | | | 257/E21.618 |
| 8,163,612 B2 | 4/2012 | Dahlstrom et al. | |
| 8,293,608 B2 | 10/2012 | Orlowski et al. | |
| 8,486,776 B2 | 7/2013 | Bedell et al. | |
| 8,492,208 B1 | 7/2013 | Cohen et al. | |

(Continued)

*Primary Examiner* — Thomas L Dickey
*Assistant Examiner* — Damon Hillman
(74) *Attorney, Agent, or Firm* — Scully, Scott, Murphy & Presser, P.C.; Daniel P. Morris, Esq.

(57) ABSTRACT

A semiconductor is provided that includes an nFET gate structure straddling over a first nanowire stack and a portion of a first SiGe layer having a first Ge content. The first nanowire stack comprises alternating layers of a tensily strained silicon layer, and a second SiGe layer having a second Ge content that is greater than the first Ge content and being compressively strained. Portions of the tensily strained silicon layers extend beyond sidewalls surfaces of the nFET gate structure and are suspended. The structure further includes a pFET gate structure straddling over a second nanowire stack and another portion of the first SiGe layer. The second nanowire stack comprises alternating layers of the tensily strained silicon layer, and the second SiGe layer. Portions of the second SiGe layers extend beyond sidewalls surfaces of the pFET gate structure and are suspended.

19 Claims, 6 Drawing Sheets

(56) References Cited

U.S. PATENT DOCUMENTS

| | | | |
|---|---|---|---|
| 8,541,774 B2* | 9/2013 | Bangsaruntip | H01L 27/1211 |
| | | | 257/24 |
| 8,716,695 B2 | 5/2014 | Cohen et al. | |
| 9,159,824 B2* | 10/2015 | Lee | H01L 29/66431 |
| 2008/0296615 A1* | 12/2008 | Savage | H01L 21/6835 |
| | | | 257/190 |
| 2014/0008729 A1 | 1/2014 | Bedell et al. | |
| 2016/0086951 A1* | 3/2016 | Kim | H01L 27/092 |
| | | | 257/351 |

* cited by examiner

METHOD TO FORM STRAINED NFET AND STRAINED PFET NANOWIRES ON A SAME SUBSTRATE

BACKGROUND

The present application relates to semiconductor technology and more particularly to a method and structure to enable tensily strained silicon nanowires within an nFET device region, and compressively stained silicon germanium alloy (SiGe) nanowires in a pFET device region.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor nanowire field effect transistors (FETs) is the next step in the evolution of complementary metal oxide semiconductor (CMOS) devices. Semiconductor nanowire FETs can achieve higher drive currents with increasingly smaller dimensions as compared to conventional planar FETs.

For semiconductor nanowire device performance increase, a strained channel material is needed. For CMOS devices, tensile strained silicon nanowires are beneficial for nFET devices, but not for pFET devices. In current nanowire technology, all the nanowire structures consists of unstrained semiconductor materials or only one strained semiconductor material, either nFET or pFET. A need thus exist for providing stained CMOS nanowires with both strained nFET nanowires and strained pFET nanowires on a same substrate.

SUMMARY

The present application provides a method and structure that enables tensily strained silicon nanowires within an nFET device region of a substrate, and compressively stained silicon germanium alloy (SiGe) nanowires in a pFET device region of the same substrate.

In one aspect of the present application, a method of forming a semiconductor structure is provided. In one embodiment of the present application, a method is provided that includes providing a material stack on a first SiGe layer having a first Ge content, the material stack includes alternating layers, and from bottom to top, of a tensily strained silicon layer, and a second SiGe layer having a second Ge content that is greater than the first Ge content and being compressively strained. The material stack and the first SiGe layer are then patterned to provide a first nanowire stack on a first remaining portion of the first SiGe layer within an nFET device region and to provide a second nanowire stack on a second remaining portion of the first SiGe layer within a pFET device region. Next, an nFET gate structure is formed straddling over a portion of the first nanowire stack and a portion of the first remaining portion of the first SiGe layer, and a pFET gate structure is also formed straddling over a portion of the second nanowire stack and a portion of the second remaining portion of the first SiGe layer. Exposed portions of each strained silicon layer in the nFET device region and exposed portions of each second SiGe layer in the pFET device region are thereafter suspended.

In another aspect of the present application, a semiconductor structure is provided. In one embodiment of the present application, a semiconductor structure is provided that includes an nFET gate structure located within an nFET device region of a substrate and straddling over a first nanowire stack and a first portion of a first SiGe layer having a first Ge content. The first nanowire stack comprises alternating layers, and from bottom to top, of a tensily strained silicon layer, and a second SiGe layer having a second Ge content that is greater than the first Ge content and being compressively strained, wherein portions of the strained silicon layers extend beyond sidewalls surfaces of the nFET gate structure and are suspended. The structure further includes a pFET gate structure located within a pFET device region of the substrate and straddling over a second nanowire stack and a second portion of the first SiGe layer. The second nanowire stack comprises alternating layers, and from bottom to top, of the tensily strained silicon layer, and the second SiGe layer, wherein portions of the second SiGe layers extend beyond sidewalls surfaces of the pFET gate structure and are suspended.

DETAILED DESCRIPTION

Figure 1:
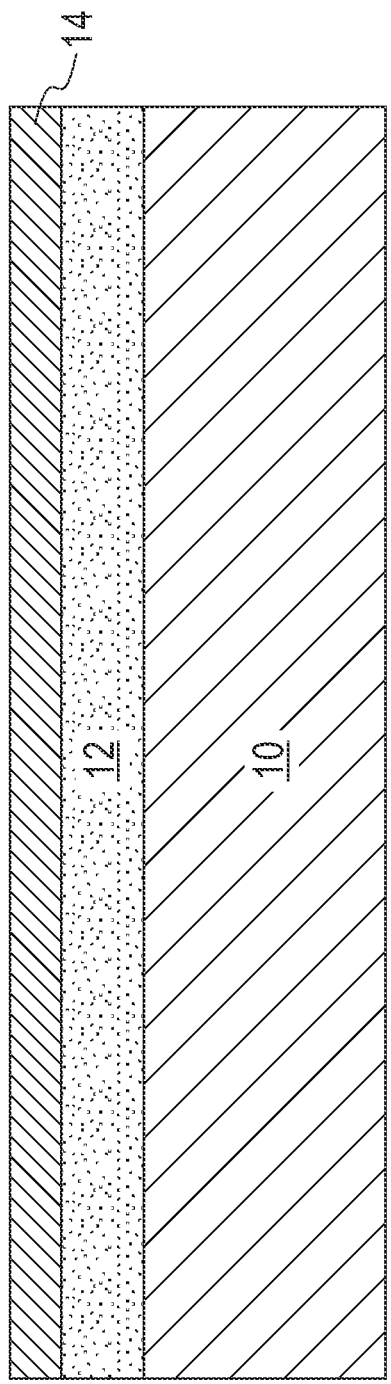
FIG. 1 is a cross sectional view of an exemplary semiconductor structure including, from bottom to top, a handle substrate, an insulator layer and a first SiGe layer having a first Ge content that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including, from bottom to top, a handle substrate 10, an insulator layer 12 and a first SiGe layer 14 having a first Ge content that can be employed in one embodiment of the present application. Collectively, the handle substrate 10, insulator layer 12 and first SiGe layer 14 may be referred to herein as a silicon germanium-on-insulator (SGOI) substrate. The handle substrate 10 provides mechanical support to the insulator layer 12 and the first SiGe layer 14.

In some embodiments of the present application, the handle substrate 10 may comprise a semiconductor material. The term "semiconductor" as used herein in connection with the semiconductor material of the handle substrate 10 denotes any semiconducting material including, for example, Si, Ge, SiGe, SiC, SiGeC, or III/V compound semiconductors such as, for example, InAs, GaAs or InP. Multilayers of these semiconductor materials can also be used as the semiconductor material of the handle substrate 10. In one embodiment, the handle substrate 10 is composed of silicon or a silicon germanium alloy (SiGe). In some embodiments, the handle substrate 10 is a non-semiconductor material including, for example, a dielectric material and/or a conductive material. In some embodiments, the handle substrate 10 may be omitted.

The handle substrate 10 and the first SiGe layer 14 may have the same or different crystal orientation. For example, the crystal orientation of the handle substrate 10 and/or the first SiGe layer 14 may be {100}, {110}, or {111}. Other crystallographic orientations besides those specifically mentioned can also be used in the present application. The handle substrate 10 of the SGOI substrate may be a single crystalline semiconductor material, a polycrystalline material, or an amorphous material.

The insulator layer 12 of the SGOI substrate may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride.

The first SiGe layer 14 of the SGOI substrate is a single crystalline material. As mentioned above, the first SiGe layer 14 of the present application has a first Ge content. In one example, the first Ge content of the first SiGe layer 14 may range from 10 atomic percent germanium to 50 atomic percent germanium.

The SGOI substrate may be formed utilizing a layer transfer process. In such a process, an optional thinning step may follow the bonding of two semiconductor wafers together. The optional thinning step reduces the thickness of the first SiGe layer 14 to a layer having a thickness that is more desirable.

In some embodiments, the thickness of first SiGe layer 14 of the SGOI substrate is from 10 nm to 100 nm. Other thicknesses that are lesser than, or greater than, the aforementioned thickness range may also be employed as the thickness of the first SiGe layer 14 in the present application. The insulator layer 12 of the SGOI substrate typically has a thickness from 1 nm to 200 nm. Other thicknesses that are lesser than, or greater than, the aforementioned thickness range may also be used as the thickness of the insulator layer 12. The thickness of the handle substrate 10 of the SGOI substrate is inconsequential to the present application.

Figure 2:
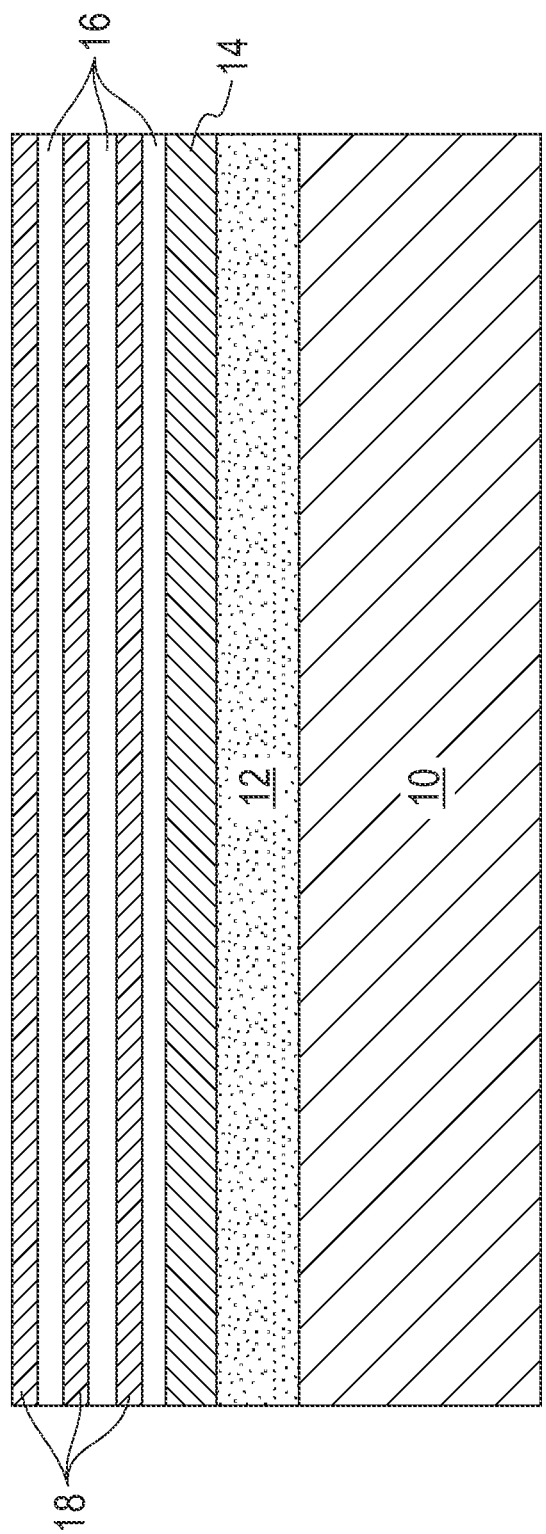
FIG. 2 is a cross sectional view of the exemplary semiconductor structure of FIG. 1 after forming a material stack on the first SiGe layer, the material stack including alternating layers, and from bottom to top, of a strained silicon layer, and a second SiGe layer having a second Ge content that is greater than the first Ge content.

Referring now to FIG. 2, there is illustrated the exemplary semiconductor structure of FIG. 1 after forming a material stack (16, 18) on the first SiGe layer 14, the material stack includes alternating layers, and from bottom to top, of a strained silicon layer 16, and a second SiGe layer 18 having a second Ge content that is greater than the first Ge content. The material stack may include 'n' numbers of strained silicon layers 16 and 'n' numbers of second SiGe layers 18, wherein 'n' is at least 1; the upper limit of 'n' may vary and can be predetermined by one skilled in the art. In one example and as shown, the upper limit of n is 3. Thus, and in the illustrated embodiment, the material stack include 3 strained silicon layers 16 and 3 second SiGe layers 18.

As is shown, the bottommost strained silicon layer 16 of the material stack has a bottommost surface that directly contacts a topmost surface of the first SiGe layer 14. As is also shown, the bottommost surface of each alternating second SiGe layer 18 of the material stack contacts a topmost surface of an underlying strained silicon layer 16. The topmost second silicon layer 18 of the material stack has a bare topmost surface.

Each strained silicon layer 16 of the material stack comprises a single crystalline silicon material. Each strained silicon layer 16 of the material stack has an epitaxial relationship, i.e., same crystal orientation, as the underlying semiconductor material that is located directly beneath the strained silicon layer 16. Each strained silicon layer 16 of the material stack is tensily strained and has a strain value from 0.5% to 1.5%.

Each second SiGe layer 18 of the material stack comprises a single crystalline silicon germanium alloy. Each second SiGe layer 18 of the material stack has an epitaxial relationship, i.e., same crystal orientation, as the underlying stained silicon layer 16 that is located directly beneath the second SiGe layer 18. Each second SiGe layer 18 of the material stack is compressively strained and has a strain value from 0.4% to 2%. As mentioned above, each second SiGe layer 18 of the material stack has a second Ge content that is greater than the first Ge content of the SiGe layer 14 of the SGOI substrate. In one example, the second Ge content of each SiGe layer 18 may range from 20 atomic percent germanium to 70 atomic percent germanium.

In one embodiment, each second SiGe layer 18 that is formed has a same second Ge content. In yet another embodiment, at least two of the second SiGe layers 18 that are formed have a different second Ge content.

The material stack including strained silicon layers 16 and second SiGe layers 18 can be formed by an epitaxial growth (or deposition) process. In one embodiment, a vacuum is maintained during the entire growth of the material stack. In yet other embodiments, the vacuum may be broken between the growth of a strained silicon layer 16 and a second SiGe layer 18 or between growths of alternating layers of strained silicon and the second SiGe layer.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth process apparatuses that are suitable for use in forming the material stack (16, 18) of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of each strained silicon layer 16 and each second SiGe layer 18. In some embodiments, the gas source for the deposition of each strained silicon layer 16 includes a silicon containing gas source. In some embodiments, the source gas for the deposition of each second SiGe layer 18 may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments, each second SiGe layer 18 can be formed from a source gas that includes a compound containing silicon and germanium. Carrier gases like hydrogen, nitrogen, helium and argon can be used.

Each strained silicon layer 16 of the material stack that is formed may have a same or different thickness. In one embodiment, each strained silicon layer 16 of the material stack has a thickness from 5 nm to 20 nm. Other thicknesses that are lesser than, or greater than, the aforementioned thickness range may also be employed as the thickness of each strained silicon layer 16 of the material stack.

Each second SiGe layer 18 of the material stack that is formed may have a same or different thickness. In one embodiment, each second SiGe layer 18 of the material stack has a thickness from 5 nm to 20 nm. Other thicknesses that are lesser than, or greater than, the aforementioned thickness range may also be employed as the thickness of each second SiGe layer 18 of the material stack.

Figure 3:
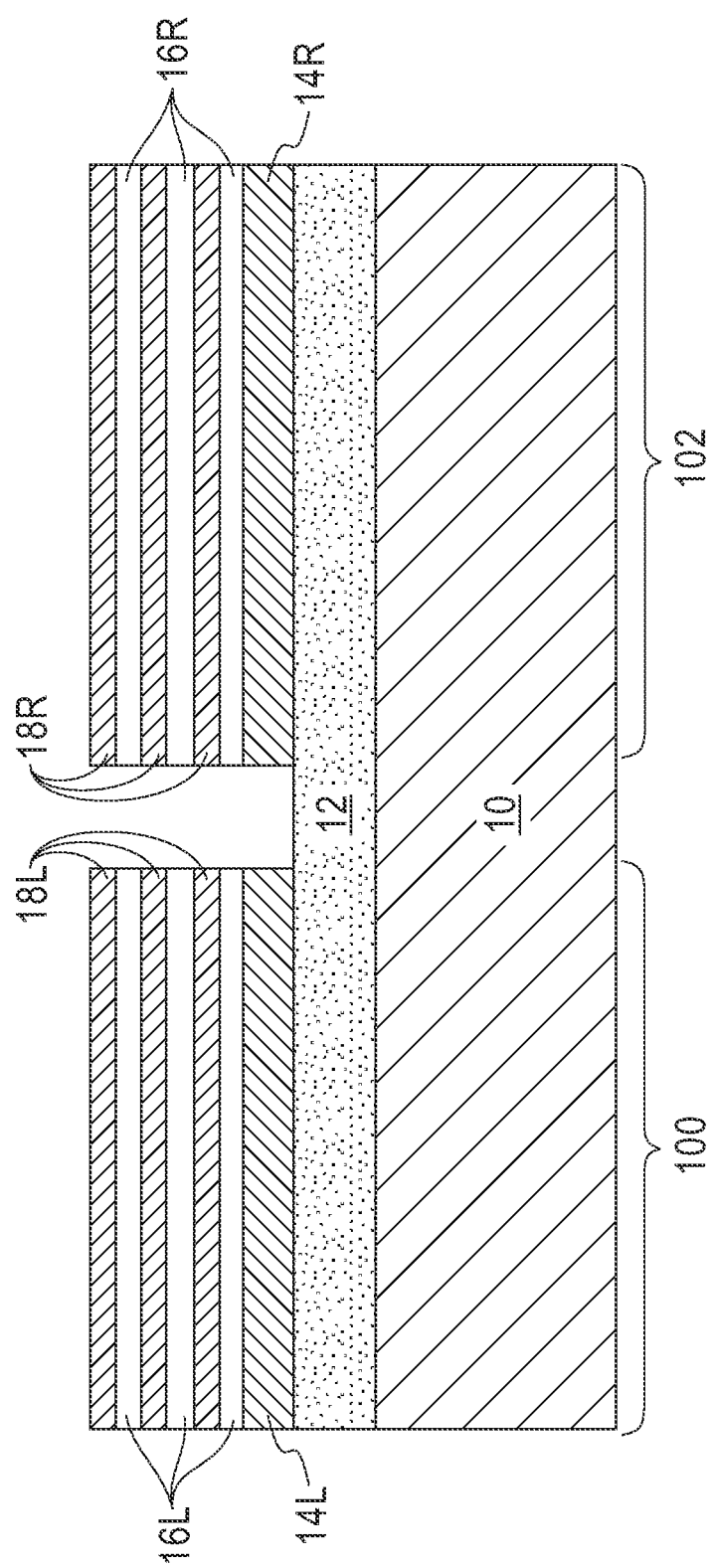
FIG. 3 is a cross sectional view of the exemplary semiconductor structure of FIG. 2 after patterning the material stack and the underlying first SiGe layer to provide a first nanowire stack on a first remaining portion of the first SiGe layer and including first remaining portions of the strained silicon layer and first remaining portions of the second SiGe layer within an nFET device region and a second nanowire stack on a second remaining portion of the first SiGe layer and including second remaining portions of the stained silicon layer and second remaining portions of the second SiGe layer within a pFET device region.

Referring now to FIG. 3, there is illustrated the exemplary semiconductor structure of FIG. 2 after patterning the material stack and the underlying first SiGe layer to provide a first nanowire stack (16L, 18R) on a first remaining portion of the first SiGe layer 14L and including first remaining portions of the strained silicon layer 16L and first remaining portions of the second SiGe layer 18L within an nFET device region 100 and a second nanowire stack (16R, 18R) on a second remaining portion of the first SiGe layer 14R and including second remaining portions of the stained silicon layer 16R and second remaining portions of the second SiGe layer 18R within a pFET device region 102. The first and second nanowire stacks are spaced apart from each other. Also, the various portions of the first SiGe layer (i.e., 14L, 14R) are spaced apart from each other.

The nFET device region 100 is an area of the exemplary semiconductor structure in which an nFET device will be subsequently formed and the pFET device region 102 is an area of the exemplary semiconductor structure in which a pFET device will be subsequently formed.

The exemplary semiconductor structure shown in FIG. 3 may be formed by patterning the material stack (16, 18) and the underlying first SiGe layer 14 of the SGOI substrate. The patterning includes a pattern transfer etch that stops on a topmost surface of the isolation layer 12 of the SGOI substrate.

In one embodiment of the present application, patterning may be achieved by lithography and etching. Lithography includes forming a photoresist material (not shown) atop the material stack. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material stack. The pattern provided by the patterned photoresist material is thereafter transferred into the underlying material stack (16, 18) and the first SiGe layer 14 utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

Figure 4:
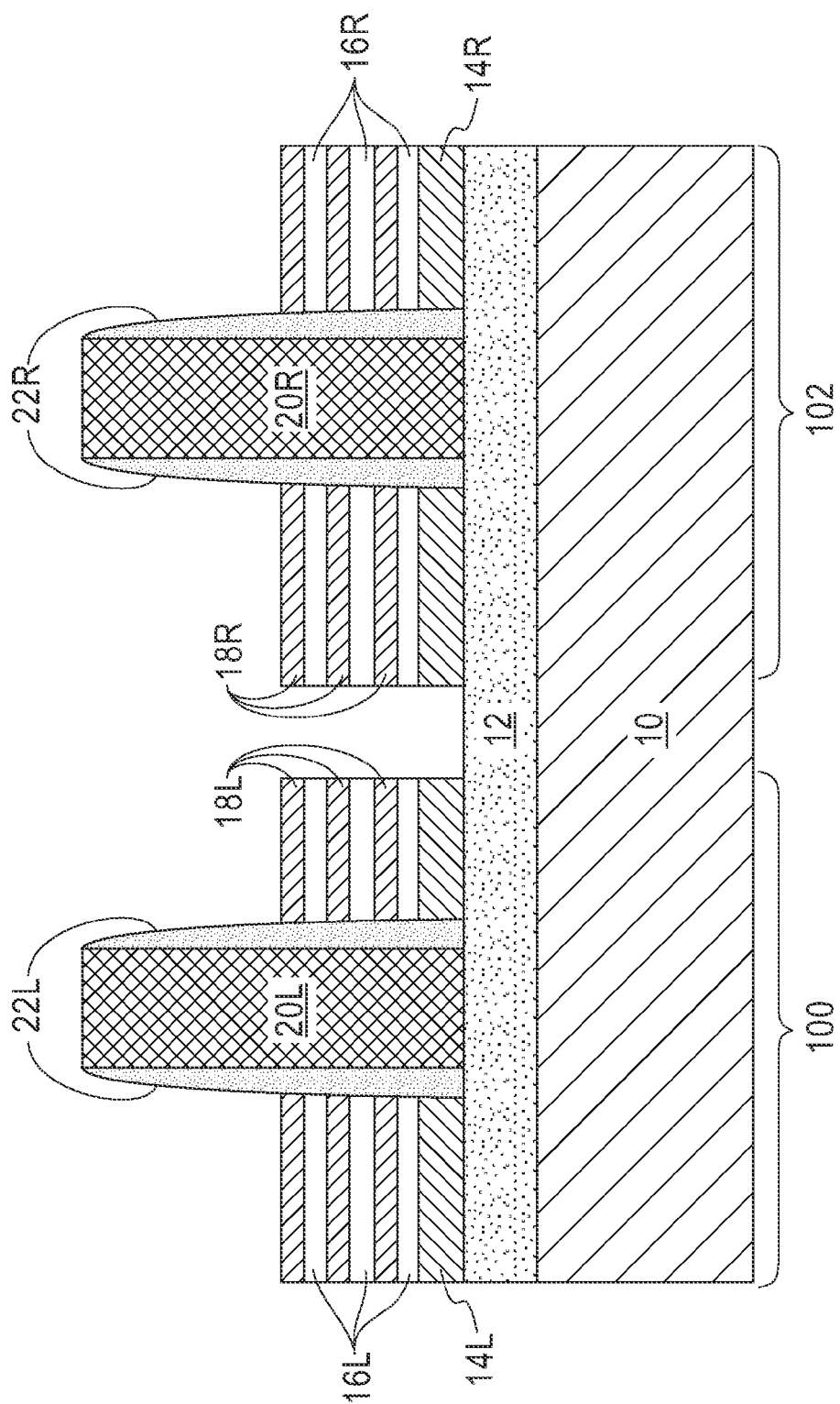
FIG. 4 is a cross sectional view of the exemplary semiconductor structure of FIG. 3 after forming an nFET gate structure straddling over a portion of the first nanowire stack and a portion of the underlying first remaining portion of the first SiGe layer, and a pFET gate structure straddling over a portion of the second nanowire stack and a portion of the underlying second remaining portion of the first SiGe layer.

Referring now to FIG. 4, there is illustrated the exemplary semiconductor structure of FIG. 3 after forming an nFET gate structure straddling over a portion of the first nanowire stack (16L, 18L) and a portion of the underlying first remaining portion of the first SiGe layer 14L, and a pFET gate structure straddling over a portion of the second nanowire stack (16R, 18R) and a portion of the underlying second remaining portion of the first SiGe layer 14R. By "straddling" it is meant that at least one portion of the gate structure is located on one side of nanowire stack and the underlying portion of the first SiGe layer, while another portion of the same gate structure is located on another side of the nanowire stack and the underlying portion of the first SiGe layer. The two gate structure portions are interconnected by a portion of the gate structure that is located directly atop of the nanowire stack. As shown in the illustrated embodiment, a portion of the gate structure contacts a topmost surface of insulator layer 12. Although a single gate structure is described and illustrated, a plurality gate structures can be formed straddling different portions of each nanowire stack and the underlying portion of the first SiGe layer.

In one embodiment (and as shown), each gate structure (i.e., nFET gate structure and FET structure) is a functional gate structure. By "functional gate structure" it is meant a permanent gate structure used to control output current (i.e., flow of carriers in the channel) of a semiconducting device through electrical or magnetic fields. Each functional gate structure includes a gate material stack of, from bottom to top, a gate dielectric portion and a gate conductor portion 20L, 20R. In some embodiments, a gate cap portion (not shown) can be present atop each gate conductor portion 20L, 20R. In the drawings, each gate dielectric portion would be located behind the gate conductor portion and contacting sidewalls of a nanowire stack and the underlying portion of the first SiGe layer.

Each gate dielectric portion of the functional gate structure comprises a gate dielectric material. The gate dielectric material that provides each gate dielectric portion can be an oxide, nitride, and/or oxynitride. In one example, the gate dielectric material that provides each gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as each gate dielectric. In some embodiments, the gate dielectric portion of the nFET gate structure comprises a same gate dielectric material as gate dielectric portion of the pFET gate structure. In other embodiments, the gate dielectric portion of the nFET gate structure comprises a different gate dielectric material than the gate dielectric portion of the pFET gate structure.

The gate dielectric material used in providing each gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions, block mask technology can be used. In one embodiment of the present application, the gate dielectric material used in providing each gate dielectric portion can have a thickness in a range from 1 nm to 10 nm. Other thicknesses that are lesser than, or greater than, the aforementioned thickness range can also be employed for the gate dielectric material.

Each gate conductor portion 20L, 20R of the functional gate structure comprises a gate conductor material. The gate conductor material used in providing each gate conductor portion 20L, 20R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 20L comprises a same conductive material as gate conductor portion 20R. In other embodiments, the gate conductor portion 20L comprises a different gate conductor material than gate conductor portion 20R. For example, the gate conductor portion 20L may comprise an nFET gate metal, while the gate conductor portion 20R may comprise a pFET gate metal.

The gate conductor material used in providing each gate conductor portion 20L, 20R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for each gate conductor portion 20L, 20R, block mask technology can be used. In one embodiment, the gate conductor material used in providing each gate conductor portion 20L, 20R has a thickness from 1 nm to 100 nm. Other thicknesses that are lesser than, or greater than, the aforementioned thickness range can also be employed for the gate conductor material used in providing each gate conductor portion 20L, 20R.

If present, the gate cap portion of the functional gate structure comprises a gate cap material. The gate cap material that provides the gate cap portion may include one of the hard mask materials mentioned above. In one embodiment, each gate cap portion comprises silicon dioxide, silicon nitride, and/or silicon oxynitride. The material that provides the gate cap portion can be formed utilizing a conventional deposition process such as, for example, chemical vapor deposition or plasma enhanced chemical vapor deposition. The material that provides the gate cap portion can has a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers 22L, 22R can be formed on exposed sidewall surfaces of the respective gate structure. The dielectric spacers may comprise a spacer dielectric material such as, for example, silicon dioxide, silicon nitride, and/or silicon oxynitride. The dielectric spacers 22L, 22R straddle over different portions of the nanowire stack and the underlying portion of the first SiGe layer. The dielectric spacers 22L, 22R can be formed by depositing a spacer material and thereafter a spacer etch can be performed.

Figure 5:
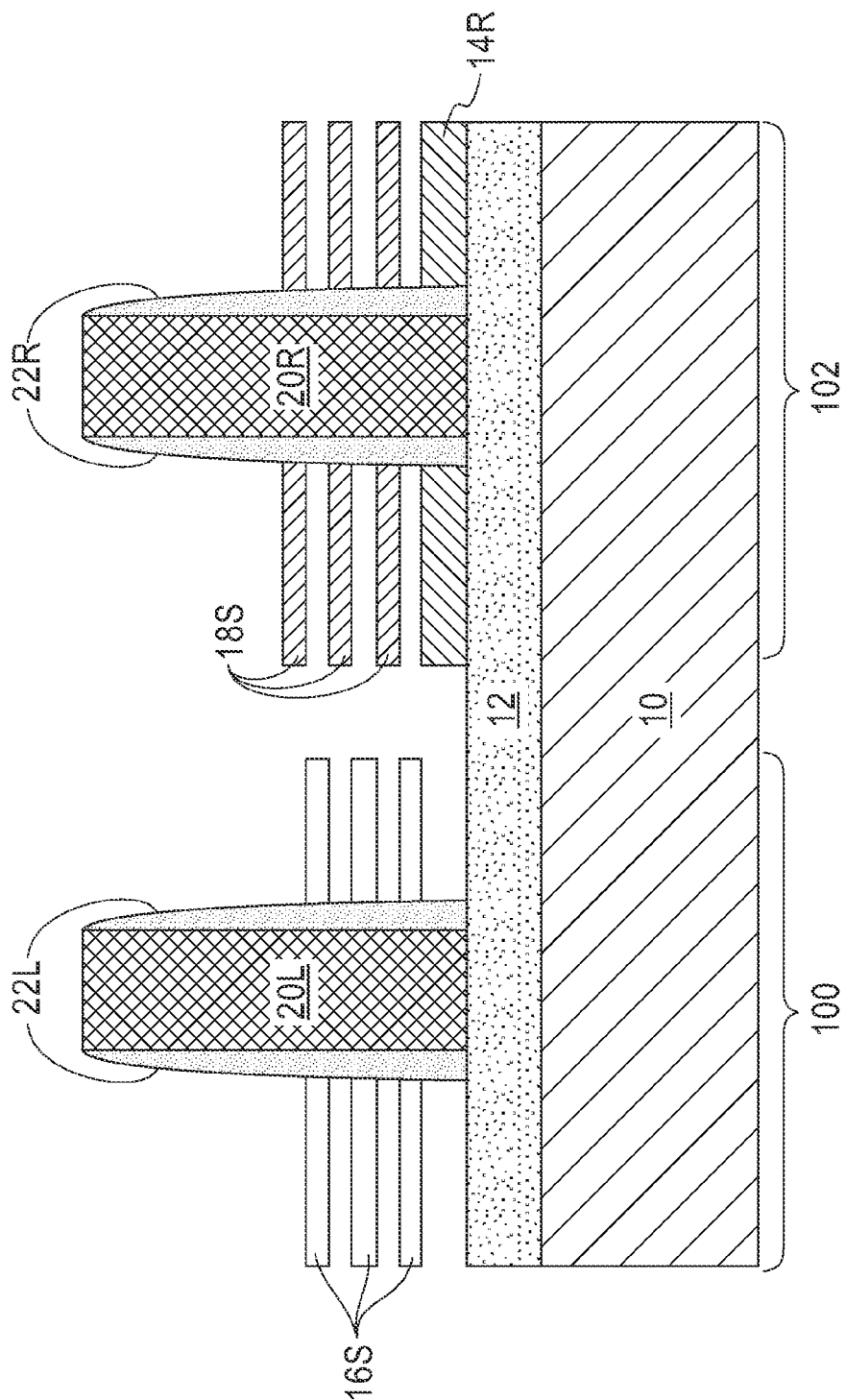
FIG. 5 is a cross sectional view of the exemplary semiconductor structure of FIG. 4 after suspending the exposed portions of each strained silicon layer within the nFET device region, and after suspending the exposed portions of each second SiGe layer in the pFET device region.

Referring now to FIG. 5, there is illustrated the exemplary semiconductor structure of FIG. 4 after suspending the exposed portions of each strained silicon layer 16L within the nFET device region 100, and after suspending the exposed portions of each second SiGe layer 18R in the pFET device region 102. Each suspended portion of the strained silicon layer 16L within the nFET device region 100 is labeled as 16S, while each suspended portion of the second SiGe layer 18R within the pFET device region 102 is labeled as 18S. The terms "suspending" denotes removing a second material that is located beneath and above a first material such that an uppermost surface and a bottommost surface of the first material are bare; as shown a gap is located beneath each suspended nanowire portion in both device regions. Beneath the respect gate structures, the nanowire stack and the underlying portion of the first SiGe layer remain. The portions of the nanowire stack and the underlying portion of the first SiGe layer that remain beneath a respective gate structure form a channel region of the structure. The nFET channel region within the nFET device region 100 includes a remaining portion of the first remaining portion of the first SiGe layer 14L, and remaining portions of the first nanowire stack (16L, 18L). The pFET channel region within the pFET device region 102 includes the second remaining portion of the first SiGe layer 14R, and remaining portions of the second nanowire stack (16R, 18R).

The suspending of each strained silicon layer 16L in the nFET device region 100 may occur prior to, or after, suspending of each second SiGe layer 18R in the pFET device region 100. Block mask technology is used to protect one of the device regions during a suspending process, and thereafter the block mask is removed from the device region. For example, and in one embodiment, the suspending of each strained silicon layer 16L in the nFET device region 100 is thus performed while a block mask is present over the pFET device 102. The block mask is thereafter removed. Another block mask can be formed over the nFET device region, and thereafter each second SiGe layer 18R in the pFET device is suspended. The another block mask is thereafter removed. The order of suspending can be reserved.

The suspending of the strained silicon layers 16L within the nFET device region 100 comprises an etching process that selectively removes SiGe as compared to silicon. In one example, gaseous HCl is used to selectively remove SiGe as compared to silicon. During this step, each second SiGe layer 18L and the underlying first SiGe layer 14L that are not located beneath the dielectric spacer 22L and the nFET gate structure (including gate conductor portion 20L) are removed.

The suspending of the second SiGe layers 18 within the pFET device region 102 comprises an etching process that selectively removes silicon as compared to SiGe. In one example, tetramethylammonium hydroxide (TMAH) is used to selectively remove silicon as compared to SiGe. During this step, each strained silicon layer 16R that is not located beneath the dielectric spacer 22R and the nFET gate structure (including gate conductor portion 20R) is removed.

Each suspended portion of the strained silicon layer (i.e., element 16S) in the nFET device region 100 remains tensily strained due to the encapsulation of the remaining strained silicon layer 16L beneath the nFET gate structure, while each suspended portion of the second SiGe layer (i.e., element 18S) in the pFET device region 102 remains compressively strained due to encapsulation of the remaining second SiGe layer 18R beneath the pFET gate structure. Each suspended portion of the second SiGe layer (i.e., element 18S) in the pFET device has sidewall surfaces that are vertically aligned, i.e., coincident, with sidewall surfaces of the underlying first SiGe layer 14R.

Figure 6:
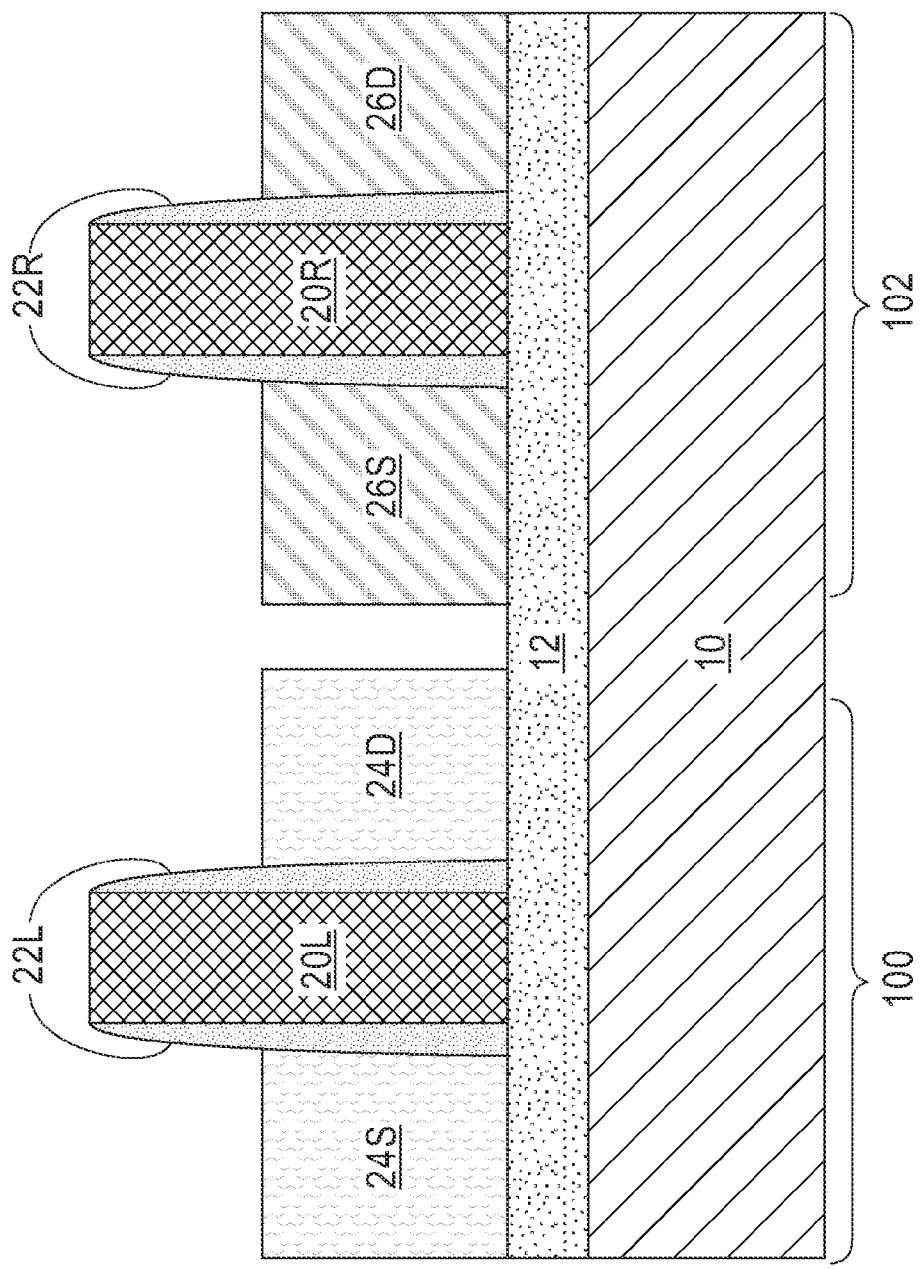
FIG. 6 is a cross sectional view of the exemplary semiconductor structure of FIG. 5 after forming source and drain nFET epitaxial doped semiconductor regions surrounding suspended portions of each strained silicon layer, and source and drain pFET epitaxial semiconductor regions surrounding suspending portions of each second SiGe layer.

Referring now to FIG. 6, there is illustrated the exemplary semiconductor structure of FIG. 5 after forming source and drain nFET epitaxial doped semiconductor regions 24S, 24D surrounding the suspended portions of each strained Si layer 16S, and source and drain pFET epitaxial doped semiconductor regions 26S, 26D surrounding suspended portions of each second SiGe layer 18S. As is shown, the topmost surface of each epitaxial doped semiconductor regions 24S, 24D, 26S, 26D is located beneath a topmost surface of the respective gate structure.

Each epitaxial doped semiconductor regions 24S, 24D, 26S, 26D includes an n-type or a p-type dopant and a semiconductor material. The semiconductor material of each epitaxial doped semiconductor regions 24S, 24D, 26S, 26D may include any of the semiconductor materials mentioned above for handle substrate 10. In one embodiment of the present application, the semiconductor material of the source and drain nFET epitaxial doped semiconductor regions 24S, 24D comprises a same semiconductor material as that used for providing the source and drain pFET epitaxial doped semiconductor regions 26S, 26D. In another embodiment of the present application, the semiconductor material of the source and drain nFET epitaxial doped semiconductor regions 24S, 24D comprises a different semiconductor material as that used for providing the source and drain pFET epitaxial doped semiconductor regions 26S, 26D. The semiconductor material for each epitaxial doped semiconductor regions 24S, 24D, 26S, 26D may maintain or, in some embodiments, even enhance the strain in the suspended nanowire portion (i.e., 16S or 18S).

Each epitaxial doped semiconductor regions 24S, 24D, 26S, 26D can be formed by a selective epitaxial growth process; by "selective" it is meant that the epitaxial semiconductor material forms only on exposed surfaces of semiconductor material. In some embodiments, the selective epitaxial growth process is an in-situ doped selective epitaxial doped process. In such an embodiment, a dopant source gas is introduced during the deposition process. In some other embodiments, the selective epitaxial growth process forms an epitaxial semiconductor material that is intrinsic (i.e., non-doped) and the dopants can be introduced after deposition by one of ion implantation or gas phase doping.

Since epitaxial growth is employed, the epitaxial doped semiconductor regions 24S, 24D have an epitaxial relationship with the suspended portions of the strained silicon layer (i.e., element 16S), while the epitaxial doped semiconductor regions 26S, 26D have an epitaxial relationship with the suspended portions of the second SiGe layer (i.e., element 18S). The various epitaxial growth process apparatuses, source gases and other deposition process as mentioned above can be used herein in providing the epitaxial doped semiconductor regions 24S, 24D, 26S, 26D.

In one embodiment, the dopant is present in each epitaxial doped semiconductor regions 24S, 24D, 26S, 26D is in a concentration ranging from $1\times10^{19}$ atoms/cm$^3$ to $10^{21}$ atoms/cm$^3$. In one embodiment of the present application, the dopant can be uniformly present in each epitaxial doped semiconductor regions 24S, 24D, 26S, 26D. In another of the present application, the dopant can be present as a gradient in each epitaxial doped semiconductor regions 24S, 24D, 26S, 26D. The thickness of each epitaxial doped semiconductor regions 24S, 24D, 26S, 26D may range from 2 nm to 100 nm. Other thicknesses that are possible and are not excluded from being used.

In some embodiments, and when sacrificial gate structures instead of functional gates, the sacrificial gate structure can now be replaced with a functional gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
providing a material stack on a first SiGe layer having a first Ge content, said material stack including alternating layers, and from bottom to top, of a tensily strained silicon layer, and a second SiGe layer having a second Ge content that is greater than the first Ge content and being compressively strained;
patterning said material stack and said first SiGe layer to provide a first nanowire stack on a first remaining portion of said first SiGe layer within an nFET device region and a second nanowire stack on a second remaining portion of said first SiGe layer within a pFET device region;
forming an nFET gate structure straddling over a portion of said first nanowire stack and a portion of said first remaining portion of said first SiGe layer, and a pFET gate structure straddling over a portion of said second nanowire stack and a portion of said second remaining portion of said first SiGe layer;
suspending, in any order, an exposed portion of each tensily strained silicon layer in said nFET device region and an exposed portion of each second SiGe layer in said pFET device region; and
forming an epitaxial doped semiconductor material surrounding each suspended portion of said strained silicon layer, and surrounding each suspended portion of said second SiGe layer.

2. The method of claim 1, wherein said material stack is formed by an epitaxial growth process.

3. The method of claim 1, wherein said first nanowire stack comprises first remaining portions of said tensily strained silicon layer and first remaining portions of said second SiGe layer, and said second nanowire stack comprises second remaining portions of said tensily strained silicon layer and second remaining portions of said second SiGe layer.

4. The method of claim 1, wherein a bottommost surface of each of said second SiGe layers directly contacts an uppermost surface of one of said tensily strained silicon layers.

5. The method of claim 1, wherein said first germanium content is from 10 atomic percent germanium to 50 atomic percent germanium, and said second germanium content is from 20 atomic percent germanium to 70 atomic percent germanium.

6. The method of claim 1, wherein said nFET gate structure is an nFET functional gate structure and said pFET gate structure is a pFET functional gate structure.

7. The method of claim 1, wherein said suspending said exposed portion of each of said tensity strained silicon layers comprises removing exposed portions of said second SiGe layer from said nFET device region utilizing an etching process that selectively removes SiGe as compared to silicon.

8. The method of claim 7, wherein said etching process further removes exposed portions of said first remaining portion of said first SiGe layer within said nFET device region.

9. The method of claim 8, wherein said etching process comprises utilizing a gaseous HCl etchant.

10. The method of claim 1, wherein said suspending said exposed portion of each of said second SiGe layers comprises removing exposed portions of said tensily stained silicon from said pFET device region utilizing an etching process that selectively removes silicon as compared to SiGe.

11. The method of claim 10, wherein said etching process comprises utilizing tetremethylammonium hydroxide.

12. The method of claim 1, wherein after said suspending a portion of said first nanowire stack remains beneath said nFET gate structure, and a portion of said second nanowire stack remains beneath said pFET gate structure.

13. A method of forming a semiconductor structure, said method comprising:
providing a material stack on a first SiGe layer having a first Ge content, said material stack including alternating layers, and from bottom to top, of a tensily strained silicon layer, and a second SiGe layer having a second Ge content that is greater than the first Ge content and being compressively strained;
patterning said material stack and said first SiGe layer to provide a first nanowire stack on a first remaining portion of said first SiGe layer within an nFET device region and a second nanowire stack on a second remaining portion of said first SiGe layer within a pFET device region;

forming an nFET gate structure straddling over a portion of said first nanowire stack and a portion of said first remaining portion of said first SiGe layer, and a pFET gate structure straddling over a portion of said second nanowire stack and a portion of said second remaining portion of said first SiGe layer; and suspending, in any order, an exposed portion of each tensily strained silicon layer in said nFET device region and an exposed portion of each second SiGe layer in said pFET device region, wherein prior to said suspending, a dielectric spacer is formed on sidewall surfaces of said nFET gate stack and said pFET gate stack.

14. The method of claim 13, further comprising forming an epitaxial doped semiconductor material surrounding each suspended portion of said strained silicon layer, and surrounding each suspended portion of said second SiGe layer.

15. A semiconductor structure comprising:
an nFET gate structure located within an nFET device region of a substrate and straddling over a first nanowire stack and a first portion of a first SiGe layer having a first Ge content, said first nanowire stack comprising alternating layers, and from bottom to top, of a tensily strained silicon layer, and a second SiGe layer having a second Ge content that is greater than the first Ge content and being compressively strained, wherein portions of said tensily strained silicon layers extend beyond sidewalls surfaces of said nFET gate structure and are suspended;

a pFET gate structure located within a pFET device region of said substrate and straddling over a second nanowire stack and a second portion of said first SiGe layer, said second nanowire stack comprising alternating layers, and from bottom to top, of said tensily strained silicon layer, and said second SiGe layer, wherein portions of said second SiGe layers extend beyond sidewalls surfaces of said pFET gate structure and are suspended; and an epitaxial doped semiconductor material surrounding suspended portions of each of said tensily strained silicon layers, and surrounding suspended portions of each of said second SiGe layers.

16. The semiconductor structure of claim 15, wherein said substrate comprises an insulator layer atop a handle substrate, and said portion of said first SiGe layer is spaced apart from said another portion of said first SiGe layer.

17. The semiconductor structure of claim 15, wherein a portion of said second portion of said first SiGe layer extends beyond sidewalls of said pFET gate structure.

18. The semiconductor structure of claim 15, wherein said epitaxial doped semiconductor material surrounding said suspended portion of each of said tensily strained silicon layers has an epitaxial relationship with said suspended portion of each of said suspended tensily strained silicon layers, and said epitaxial doped semiconductor material surrounding said suspended portions of each of said second SiGe layers has an epitaxial relationship with said suspended portions of each of said suspended second SiGe layers.

19. The semiconductor structure of claim 15, wherein said first germanium content is from 10 atomic percent germanium to 50 atomic percent germanium, and said second germanium content is from 20 atomic percent germanium to 70 atomic percent germanium.

* * * * *